(12) United States Patent
Höppel

(10) Patent No.: US 9,293,661 B2
(45) Date of Patent: Mar. 22, 2016

(54) SUPPORT FOR AN OPTOELECTRONIC SEMICONDUCTOR CHIP, AND SEMICONDUCTOR CHIP

(75) Inventor: Lutz Höppel, Alteglofsheim (DE)

(73) Assignee: OSRAM Opto Semiconductors GmbH (DE)

( * ) Notice: Subject to any disclaimer, the term of this patent is extended or adjusted under 35 U.S.C. 154(b) by 8 days.

(21) Appl. No.: 13/994,928

(22) PCT Filed: Dec. 5, 2011

(86) PCT No.: PCT/EP2011/071722
§ 371 (c)(1), (2), (4) Date: Jul. 18, 2013

(87) PCT Pub. No.: WO2012/080015
PCT Pub. Date: Jun. 21, 2012

(65) Prior Publication Data
US 2013/0292735 A1    Nov. 7, 2013

(30) Foreign Application Priority Data
Dec. 17, 2010 (DE) .................. 10 2010 054 898

(51) Int. Cl.
| H01L 33/48 | (2010.01) |
| H01L 23/498 | (2006.01) |
| H01L 25/16 | (2006.01) |
| H01L 33/62 | (2010.01) |

(52) U.S. Cl.
CPC .......... *H01L 33/48* (2013.01); *H01L 23/49827* (2013.01); *H01L 25/167* (2013.01); *H01L 33/62* (2013.01); *H01L 33/483* (2013.01); *H01L 2924/0002* (2013.01)

(58) Field of Classification Search
USPC .......................................................... 257/99
See application file for complete search history.

(56) References Cited

U.S. PATENT DOCUMENTS

| 4,528,259 | A | * | 7/1985 | Sullivan | .................... G03F 7/00 |
| | | | | | 205/120 |
| 5,646,433 | A | * | 7/1997 | Jimenez | .............. H01L 27/0255 |
| | | | | | 257/355 |
| 6,506,632 | B1 | * | 1/2003 | Cheng | .................... H01L 21/568 |
| | | | | | 257/E23.069 |
| 8,450,751 | B2 | | 5/2013 | Engl et al. | |

(Continued)

FOREIGN PATENT DOCUMENTS

| DE | 10 2008 024 443 A1 | 12/2008 | |
| DE | WO2009121319 | * 8/2009 | .............. H01L 33/00 |

(Continued)

OTHER PUBLICATIONS

Written opinion p. 237.IN.*

(Continued)

*Primary Examiner* — Zandra Smith
*Assistant Examiner* — Lawrence Tynes, Jr.
(74) *Attorney, Agent, or Firm* — DLA Piper LLP (US)

(57) ABSTRACT

A support for an optoelectronic semiconductor chip includes a support body with a first main face and a second main face opposite the first main face, at least one electrical plated-through hole extending from the first main face to the second main face and formed in the support body, and an insulating layer arranged on the first main face, the insulation layer covering the electrical plated-through hole only in regions.

15 Claims, 3 Drawing Sheets

(56) References Cited

U.S. PATENT DOCUMENTS

| | | |
|---|---|---|
| 2002/0137246 A1 | 9/2002 | Takimoto et al. |
| 2004/0222433 A1 | 11/2004 | Mazzochette et al. |
| 2005/0023548 A1 | 2/2005 | Bhat et al. |
| 2005/0151246 A1 | 7/2005 | Daeche et al. |
| 2006/0057751 A1 | 3/2006 | Shen |
| 2007/0090510 A1 | 4/2007 | Tseng et al. |
| 2008/0035935 A1 | 2/2008 | Shum |
| 2008/0284041 A1* | 11/2008 | Jang .................. H01L 21/76898 257/774 |
| 2009/0101897 A1 | 4/2009 | Murphy et al. |
| 2010/0078655 A1* | 4/2010 | Yang ................. H01L 23/49816 257/81 |
| 2010/0164120 A1 | 7/2010 | Nakayama et al. |
| 2010/0213498 A1 | 8/2010 | Kim |
| 2010/0264512 A1* | 10/2010 | Lin ....................... H01L 27/016 257/528 |

FOREIGN PATENT DOCUMENTS

| | | | | |
|---|---|---|---|---|
| DE | WO2009121319 | * | 10/2009 | ............. H01L 33/00 |
| DE | 10 2009 022 966 A1 | | 12/2010 | |
| DE | 10 2009 032 486 A1 | | 1/2011 | |
| EP | WO2010049852 | * | 5/2010 | ............ H01L 23/498 |
| EP | 2 219 241 A | | 8/2010 | |
| JP | 2006-86469 | | 3/2006 | |
| JP | 2010-500780 | | 1/2010 | |
| TW | 457727 | | 10/2001 | |
| TW | 200903863 | | 1/2009 | |
| WO | 2009/057983 A2 | | 5/2009 | |
| WO | 2009/121319 A1 | | 10/2009 | |
| WO | 2010/049852 A1 | | 5/2010 | |
| WO | WO2010049852 | * | 5/2010 | ............ H01L 23/498 |

OTHER PUBLICATIONS

Japanese Examination Report dated May 7, 2014 from corresponding Japanese Patent Application No. 2013-542490.

English translation of Taiwanese Notification for the Opinion of Examination dated Jun. 24, 2014 from corresponding Taiwanese Application No. 100146504.

* cited by examiner

SUPPORT FOR AN OPTOELECTRONIC SEMICONDUCTOR CHIP, AND SEMICONDUCTOR CHIP

TECHNICAL FIELD

This disclosure relates to a support for an optoelectronic semiconductor chip, and to a semiconductor chip comprising such a support.

BACKGROUND

Semiconductor bodies that generate radiation, for example, semiconductor bodies of light-emitting diodes, can be arranged on supports in which electrical contact can be made with the semiconductor bodies through the support via feedthroughs from the rear side of the semiconductor chip. However, such feedthroughs can have comparatively high series resistances which makes efficient operation of the light-emitting diode more difficult.

There is therefore a need to provide a support for an optoelectronic semiconductor chip with which the optoelectronic semiconductor chip has improved properties.

SUMMARY

I provide a support for an optoelectronic semiconductor chip including a support body having a first main face and a second main face opposite the first main face, at least one electrical plated-through hole extending from the first main face to the second main face and formed in the support body, and an insulation layer arranged on the first main face, the insulation layer covering the electrical plated-through hole only in regions.

I also provide a semiconductor chip including the support, wherein a semiconductor body having an active region that generates radiation is arranged on the support on the part of the first main face and is electrically conductively connected to the connection area.

I further provide a support for an optoelectronic semiconductor chip including a support body having a first main face and a second main face opposite the first main face, at least one electrical plated-through hole extending from the first main face to the second main face and formed in the support body, and an insulation layer arranged on the first main face, the insulation layer covering the electrical plated-through hole only in regions, a connection area formed on a side of the insulation layer facing away from the support body, the connection area being electrically conductively connected to the plated-through hole, the support has further plated-through hole electrically conductively connected to a further contact area on the second main face of the support body, and the further contact area covers the plated-through hole in regions.

DETAILED DESCRIPTION

Figure 1A:
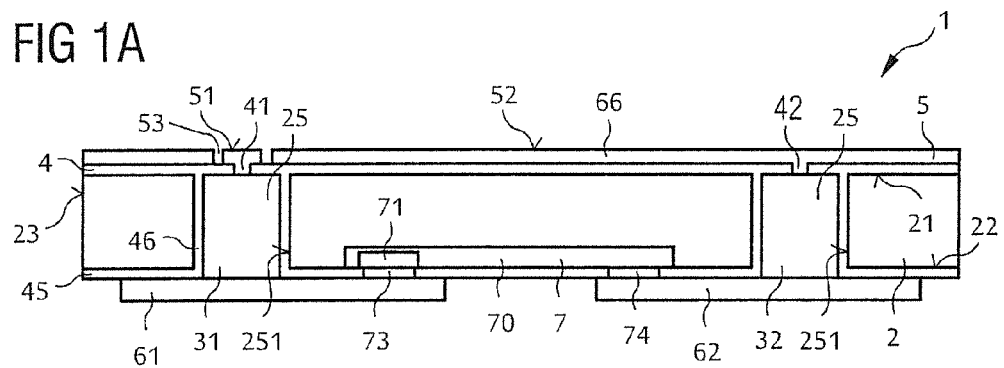
FIGS. 1A and 1B show a first example of a support in a schematic plan view (FIG. 1B) and associated sectional view (FIG. 1A).

My support for an optoelectronic semiconductor chip may comprise a support body having a first main face and a second main face opposite the first main face. At least one electrical plated-through hole extending from the first main face to the second main face is formed in the support body. An insulation layer is arranged on the first main face, the insulation layer covering the electrical plated-through hole only in regions.

In a plan view of the support, therefore, the insulation layer overlaps the electrical plated-through hole, but does not cover the latter completely. The insulation layer preferably directly adjoins the first main face of the support at least in regions.

In particular, the insulation layer can have a cutout formed within the plated-through hole in a plan view of the support.

The size of the region of the support in which the plated-through hole is accessible for an electrically conductive connection on the part of the first main face is adjustable by the cutout.

The plated-through hole expediently extends through a penetration in the support body. Furthermore, the plated-through hole expediently consists of an electrically conductive material, for example, a metal or a metallic alloy.

The side walls of the penetration are preferably covered with a second insulation layer. The plated-through hole can thus be electrically insulated from the support body.

Preferably, a connection area is formed on that side of the insulation layer facing away from the support body, the connection area being electrically conductively connected to the plated-through hole.

The connection area is provided for electrically conductive connection to an optoelectronic semiconductor chip, for example, a semiconductor chip that generates radiation, for instance a light-emitting diode.

Preferably, a further connection area is formed on that side of the insulation layer facing away from the support body, the further connection area covering the plated-through hole in regions. The further connection area is expediently spaced apart from the connection area.

Preferably, an opening is formed in the further connection area in which opening the connection area is arranged. On account of the insulation layer, an area of the opening can be smaller than an area of the plated-through hole, without the plated-through hole and the penetration being electrically connected to one another. In other words, the size of the opening is adjustable independently of the size of the plated-through hole.

To reduce the series resistance of the plated-through hole, therefore, the cross section of the plated-through hole in a plan view of the support can be enlarged, without the cross section of the opening having to be enlarged.

Preferably, the support body comprises a semiconductor material. In particular, silicon is suitable on account of the good microstructurability and the cost-effective large-are availability.

The support body preferably has a resistivity of at least 500 Ωcm, preferably a resistivity of 500 Ωcm to 10 000 Ωcm, particularly preferably 1000 to 2000 Ωcm.

With such a high-resistance support, the risk of an electrical short circuit during the mounting of the support or of a semiconductor chip comprising such a support can be avoided.

Preferably, a contact area is arranged on the second main face of the support body, the contact area being electrically conductively connected to the plated-through hole. The contact area is provided to externally make electrical contact with the support or the semiconductor chip comprising such a support.

The support furthermore preferably comprises a further plated-through hole. The further plated-through hole preferably electrically conductively connects to a further contact area on the second main face of the support body. Furthermore, the further plated-through hole preferably electrically conductively connects to the further connection area on the first main face of the support body. To externally make electrical contact with a semiconductor chip comprising such a support, therefore, two contact areas are available on the rear side of the semiconductor chip. A front side of the semiconductor chip can thus be free of contact areas in a simple way.

Preferably, a third insulation layer is arranged between the contact area and the second main face of the support.

The terms insulation layer, second insulation layer and third insulation layer do not necessarily mean that the layers are produced in different production steps. Rather, two or more of the insulation layers described can be produced in a common production step and in each case constitute parts of a common layer.

Preferably, the support comprises a diode structure. Preferably, the diode structure is formed in the support body. In other words, the diode structure is integrated into the support body. The diode structure can be provided, for example, for protection against electrostatic discharge (ESD).

The diode structure preferably adjoins the second main face of the support body. In particular, the diode structure is expediently electrically conductively connected by the contact area and the further contact area such that the diode structure forms a preferably unidirectional charge carrier path between the first contact area and the further contact area.

Preferably, the diode structure has a first partial region of a first conduction type. In a plan view of the support, the first partial region is preferably spaced apart from the side faces of the support. The diode structure furthermore preferably has a second partial region of a second conduction type, which is different than the first conduction type, wherein the first partial region preferably encloses the second partial region in a plan view of the semiconductor chip. In particular, the first partial region can be formed as a well-type partial region within the support body, wherein the second partial region is formed completely within the first partial region. The second partial region is therefore completely separated from the remaining part of the support body by the first partial region.

The support is preferably formed in a support assemblage provided for the production of a plurality of semiconductor chips each comprising a support from the support assemblage. That is to say that the support of the semiconductor chip emerges during production of the semiconductor chips from singulation of the support assemblage after the semiconductor bodies of the semiconductor chips have already been fixed to the respective supports.

A semiconductor chip comprising a support described preferably comprises a semiconductor body arranged on the support on the part of the first main face and electrically conductively connects to the connection area. The semiconductor body can have, for example, an active region that generates or receives radiation.

Preferably, a growth substrate for a semiconductor layer sequence of the semiconductor body is removed. After the semiconductor body has been fixed to the support, the latter mechanically stabilizes the semiconductor body such that the growth substrate is no longer necessary therefor and can be removed.

In a preferred configuration Preferably, a side face of the support body is exposed. Such a semiconductor chip can be produced in a simplified manner since the support emerging from the support assemblage after singulation need no longer be coated at the side faces.

Further features, configurations and expediencies will become apparent from the following description of the examples in conjunction with the figures.

Elements that are identical, of identical type or act identically are provided with the same reference signs in the figures.

The figures and the size relationships of the elements illustrated in the figures among one another should not be regarded as true to scale. Rather, individual elements may be illustrated with exaggerated size to enable improved illustration and/or to afford a better understanding.

Figure 1B:
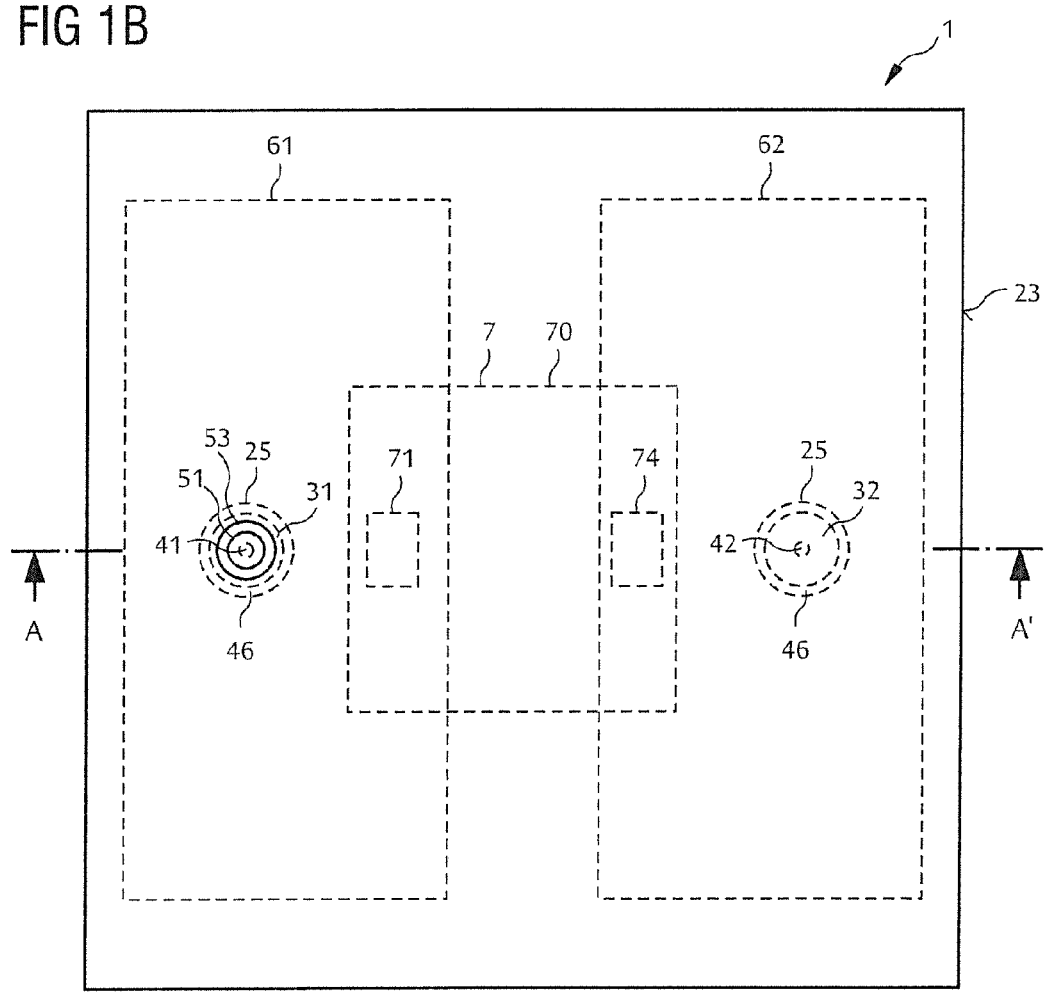

A support 1 in accordance with the example illustrated in FIGS. 1A and 1B comprises a support body 2 having a first main face 21 and a second main face 22 opposite the first main face, the second main face running parallel to the first main face. The main faces delimit the support body in a vertical direction, that is to say perpendicularly to the first main face 21 of the support body 2. Penetrations 25 extending through the support body 2 in a vertical direction are formed in the support 1.

A plated-through hole 31 is formed in one of the penetrations 25, the plated-through hole extending from the first main face 21 to the second main face 22 of the support body. On the part of the first main face 21, the plated-through hole electrically conductively connects to a connection area 51. The connection area 51 directly adjoins the plated-through hole 31 in regions.

An insulation layer 4 is formed on the first main face 21 of the support body 2, the insulation layer covering the plated-through hole in regions. A cutout 41 is formed in the insulation layer 4, the cutout overlapping the plated-through hole 31 in a plan view of the support 1. In particular, the cutout runs within the plated-through hole. The insulation layer 4 runs in a vertical direction in regions between the connection area 51 and the plated-through hole 31.

On the part of the second main face 22 of the support body 2, the plated-through hole 31 electrically conductively connects to a contact area 61. The contact area 61 is provided to externally make electrical contact with the support 1.

Furthermore, the support comprises a further plated-through hole 32 electrically conductively connected to a further connection area 52 on the part of the first main face 21. The plated-through holes 31, 32 are spaced apart from one another in a lateral direction.

The plated-through hole electrically conductively connects to a further contact area 62 on the part of the second main face 22.

A respective second insulation layer 46 is formed between the plated-through holes 31, 32 and the support body 2 and electrically insulates the plated-through holes from the support body. The second insulation layer covers the side walls 251 of the penetrations 25.

A third insulation layer 45 is formed on the second main face, the third insulation layer running in regions between the support body 2 and the contact area 61 and also in regions between the support body and the further contact area 62.

The connection area 51 and the further connection area 52 are preferably formed as parts of a common connecting layer 5. The further connection area 52 has an opening 53, within which the connection area 51 is formed. A cross section of the opening 53 is smaller than a cross section of the penetration 25.

The insulation layer 4 ensures that there is no direct electrical contact between the further connection area 52 and the plated-through hole 31.

On account of the insulation layer 4, therefore, the minimum cross section of the opening 53 is not predetermined by the cross section of the penetration 25 or of the plated-through hole 31, but rather by the cross section of the cutout 41 in the insulation layer 4.

Given the same cross section of the opening 53, therefore, the cross section of the plated-through hole 31 can be increased, as a result of which the series resistance of the plated-through hole decreases. To obtain sufficiently low series resistances, a material having a lower electrical conductivity than gold, which is comparatively expensive, can therefore also be used for the plated-through hole.

By way of example, the plated-through hole 31 can contain aluminum, silver, copper of a metallic alloy containing at least one of the aforementioned materials or gold, for example, a gold-tin alloy, or consist of such a material.

A further cutout 42 is formed in the insulation layer 4, the further cutout overlapping the further plated-through hole 32. The further cutout 42 of the insulation layer 4 can be formed in a manner corresponding to the cutout 41. In a departure therefrom, the cross section of the further cutout 42 can also be larger than the cross section of the cutout 41. Expediently, however, the cross section of the further cutout is smaller than the cross section of the further plated-through hole 32.

A side face 23 delimiting the support 1 in a lateral direction is exposed, that is to say is not covered by an insulation layer. During production of the support by singulation from a support assemblage, the side face can thus be formed directly during singulation. Subsequent application of an insulation layer on the already singulated supports can thus be avoided.

The support body 2 preferably comprises a semiconductor material. Silicon, in particular, is suitable on account of its good microstructurability, the comparatively high thermal conductivity, and is furthermore distinguished by a large-area and cost-effective availability.

The support body 2 preferably has a resistivity of at least 500 Ωcm, preferably a resistivity of 500 Ωcm to 10 000 Ωcm, particularly preferably 1000 to 2000 Ωcm. A sufficiently high resistivity makes it possible to avoid the risk of an electrical short circuit during the mounting of the support, also at the exposed side faces 23 of the support, for example, on account of a solder or electrically conductive adhesive adjoining the side faces of the support body.

A diode structure 7 is integrated in the support body 2. The diode structure 7 adjoins the second main face 22 of the support body 2.

The diode structure 7 has a first partial region 71 of a first conduction type. In a plan view of the semiconductor chip, the first partial region overlaps the contact area 61 and the further contact area 62. As a result of the diode structure being formed in the region of the second main face 22, this can be configured in a simple manner with regard to the geometry thereof largely independently of the configuration of the plated-through holes and of the insulation layer 4 adjoining the first main face. The diode structure can thus be implemented with a comparatively large area.

In a plan view of the support, a second partial region 71 of a second conduction type, which is different than the first conduction type, is formed within the first partial region 71. Preferably, the first partial region is formed in a p-conducting fashion and the second partial region in an n-conducting fashion. In a plan view of the support 1, the second partial region overlaps only one of the contact areas, the contact area 61 in the example shown. The second partial region 71 electrically conductively connects to the contact area 61 by a diode connection 73.

The first partial region 70 electrically conductively connects to the further contact area 62 by a further diode connection 74.

The partial regions 70, 71 can be formed, for example, by ion implantation in the support body 2.

The diode connections 73, 74 are expediently formed by a metal which forms a sufficiently good electrical contact with the material of the first partial region and respectively of the second partial region of the diode structure 7.

The functioning of the diode structure will be explained in greater detail in association with FIG. 3.

Materials to which an electrically conductive connection can be produced in a simplified manner, for example, by soldering, are suitable, in particular, for the contact areas 61, 62 and the connection areas 51, 52.

By way of example, the contact areas and/or the connection areas can contain titanium, platinum, gold, silver, nickel or tungsten or a metallic alloy comprising at least one of the aforementioned materials or consist of such a material. In particular, the areas mentioned can also be multilayered.

In particular, an oxide, for example, silicon oxide, a nitride, for example, silicon nitride, or an oxynitride, for example, silicon oxynitride, is suitable for the insulation layers 4, 45, 46.

Figure 2:
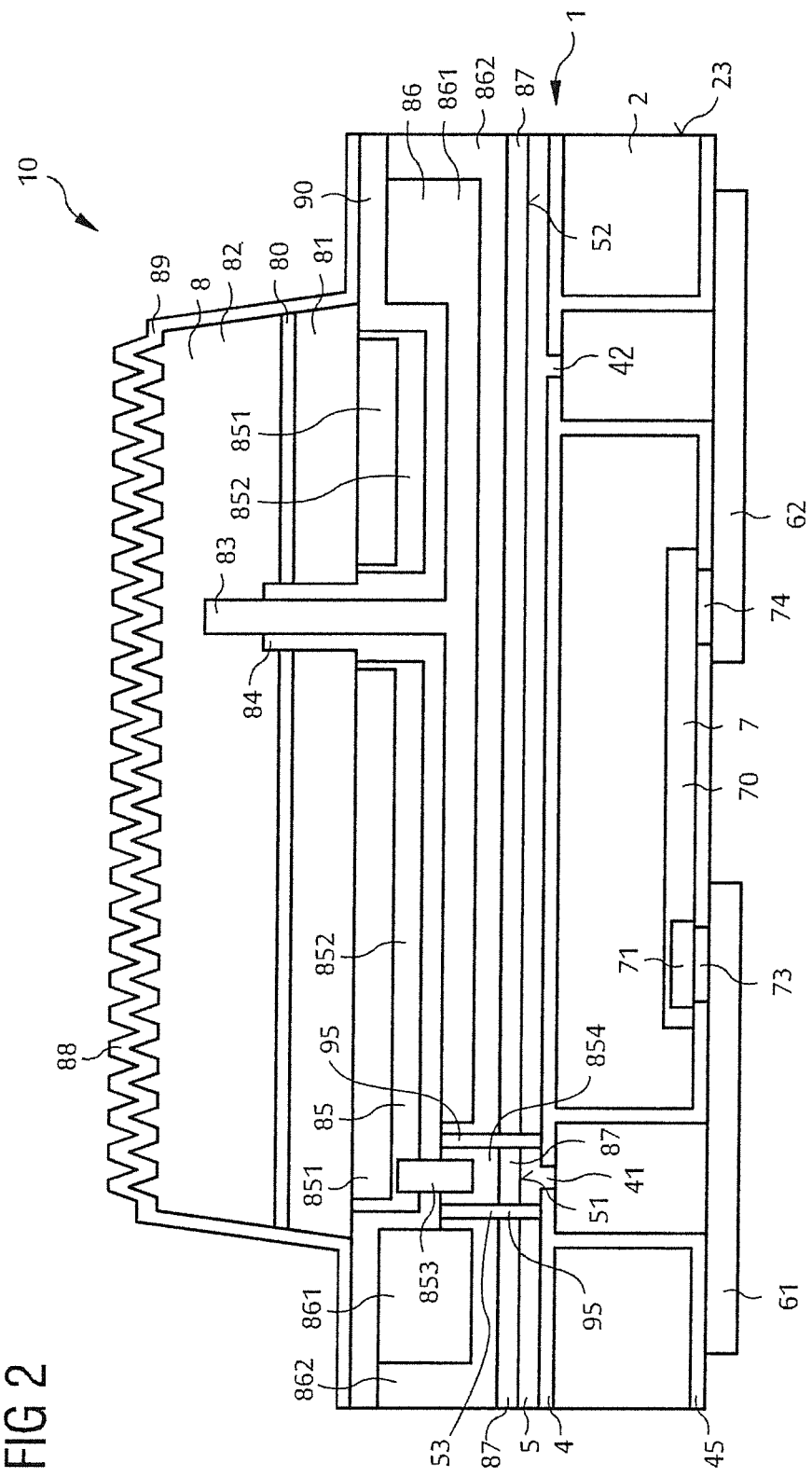
FIG. 2 shows an example of a semiconductor chip including a support in a schematic sectional view.

An example of a semiconductor chip is illustrated schematically in sectional view in FIG. 2. The semiconductor chip 10 comprises a support 1 as described in association with FIGS. 1A and 1B. Furthermore, the semiconductor chip comprises a semiconductor body 8 having a semiconductor layer sequence having an active region 80 that generates radiation, the active region being arranged between a first semiconductor layer 81 and a second semiconductor layer 82.

The semiconductor body 8, in particular the active region 80, preferably contains a III-V compound semiconductor material. III-V semiconductor materials are particularly suitable to generate radiation in the ultraviolet ($Al_xIn_yGa_{1-x-y}N$) through the visible ($Al_xIn_yGa_{1-x-y}N$, in particular for blue to green radiation, or $Al_xIn_yGa_{1-x-y}P$, in particular for yellow to red radiation) to the infrared ($Al_xIn_yGa_{1-x-y}As$) spectral range. Here, in each case $0 \leq x \leq 1$, $0 \leq y \leq 1$ and $x+y \leq 1$ hold true, in particular where $x \neq 1$, $y \neq 1$, $x \neq 0$ and/or $y \neq 0$. With III-V semiconductor materials, in particular from the material systems mentioned, high internal quantum efficiencies can furthermore be obtained during the generation of radiation.

In a departure from the example described, the semiconductor chip 1 can also be a radiation receiver.

From the side facing the support 1, a recess 83 is formed in the semiconductor body 8, the recess extending through the active region 80 into the second semiconductor layer 82 such that electrical contact can be made with this semiconductor layer from the side facing the support. The recess is spaced apart in a lateral direction from a side face of the semiconductor body 8. To avoid an electrical short circuit, a side face of the recess 83 is covered by a fourth insulation layer 84 at least in regions. The semiconductor body 83 preferably has a plurality of recesses 83. Injection of charge carriers uniform in a lateral direction via the second semiconductor layer 82 into the active region 80 is thus realized in a simple manner.

The second semiconductor layer 82 electrically conductively connects to the further connection area 52 of the support 1 via a second connection region 86. In this example, the second connection region has, by way of example, a first layer 861, which extends through the recess 83 as far as the second semiconductor layer 82. A second layer 862 is formed on that side of the first layer facing away from the semiconductor body, the second layer completely surrounding the first layer. The first semiconductor layer 81 electrically conductively connects to the connection area 51 via a first connection region 85.

A growth substrate for the semiconductor layer sequence of the semiconductor body 8 is removed. After the semiconductor body has been mounted on the support 1, the latter mechanically stabilizes the semiconductor body.

The first connection region 85 is arranged in regions between the second connection region 86 and the semiconductor body 8. Furthermore, a fifth insulation layer 90 is formed between the first connection region 85 and the second connection region 86, the fifth insulation layer electrically insulating the connection regions from one another. The first connection region is multilayered in a manner similar to the second connection region 86 and has, as viewed from the semiconductor body 8, a first layer 851, a second layer 852, a third layer 853 and a fourth layer 854.

The layers directly adjoining the semiconductor body, that is to say the first layer 851 of the first connection region 85 and the first layer 861 of the second connection region 86, preferably have a high reflectivity for the radiation generated in the active region 80. In particular, silver is suitable for radiation in the visible spectral range. Alternatively, however, aluminum, nickel, rhodium or palladium can also be used, for example.

The respectively associated first layer can be encapsulated by the second layers 852, 862 of the connection regions 85 and 86, respectively, such that, for example, oxidation or migration of material of the first layer, for example, silver, is avoided.

The described layers of the first and second connection regions can in each case be deposited at least partly in common production steps.

A further connecting layer 87 is formed on the side facing the support 1, the further connecting layer being provided for electrically conductive and mechanically stable connection to the connecting layer 5 of the support 1. In particular, a solder comprising, for example, at least one of the materials titanium, gold or tin is suitable for the connecting layer and the further connecting layer.

An interspace 95 is formed between the first connection region 85 and the second connection region 86, the interspace also extending through the connecting layers 5, 87 and serving as electrical insulation.

During operation of the semiconductor chip, when an external electrical voltage is applied between the contact area 61 and the further contact area 62, charge carriers are injected from different sides into the active region 80 and recombine there with emission of radiation. External contact can be made exclusively from the rear side of the semiconductor chip, that is to say on the part of the second main face 22 of the support. By contrast, the front side of the semiconductor chip can be completely free of external contact areas for the semiconductor chip, thereby avoiding shading of the radiation generated in the active region 80.

To increase the coupling-out efficiency of the radiation generated, the front-side radiation exit area facing away from the support 1 has a structuring 88, which can be regular or irregular, for example, as a roughening.

A passivation 89 is formed on the semiconductor body 8, which passivation, in particular, covers the front-side radiation exit area and the side faces of the semiconductor body 8 and protects them against adverse external environmental influences.

Figure 3:
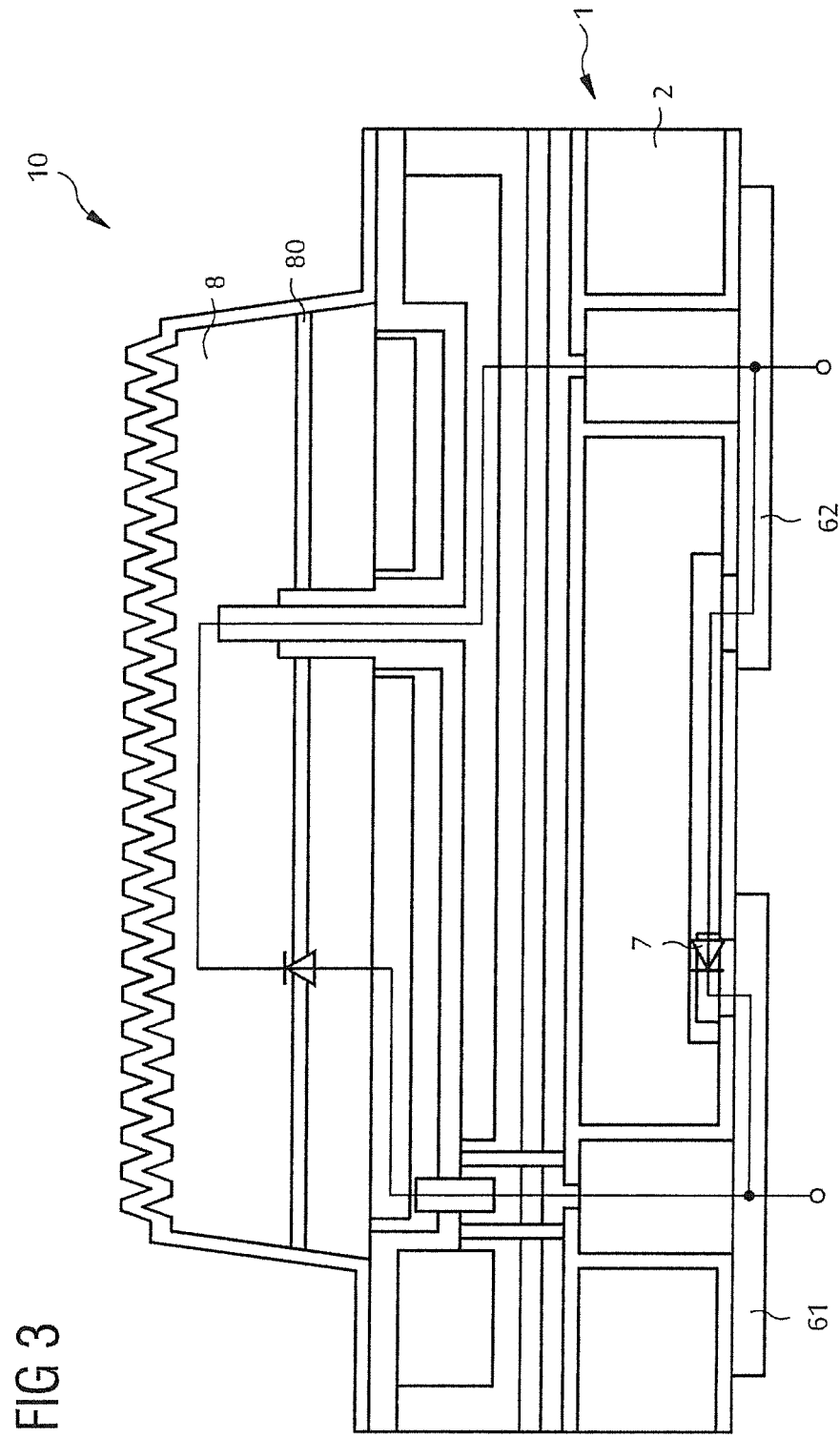
FIG. 3 shows a schematic illustration of possible current paths in the semiconductor chip in accordance with the examples illustrated in FIG. 2.

Possible current paths in a semiconductor chip in accordance with the example illustrated in FIG. 2 are shown schematically in FIG. 3 for the case where the first semiconductor layer 81 is a p-conductor and the second semiconductor layer 82 is an n-conductor.

As a result of a positive voltage being applied to the contact area 61 relative to the further contact area 62, charge carriers are injected in the forward direction into the active region 80 and can recombine there with emission of radiation. The pn junction between the first partial region and the second partial region of the diode structure 7 is reverse-connected in parallel with the active region with regard to the forward direction of the diode structure. With this polarity of the voltage present, the diode structure is therefore oriented in the reverse direction such that no significant current flow takes place via this current path in regular operation of the semiconductor chip.

If, by contrast, a positive voltage is present at the further contact area 62 relative to the contact area 61, for example, on account of electrostatic charging, the charge carriers can flow away via the diode structure 7 through a current path within the support 1, in particular within the support body 2. The risk of damage to the active region on account of a high voltage present in the reverse direction can thus be avoided. By virtue of the configuration of the diode structure 7 at the second main face of the support 22, this can be configured with a large area in a simple manner, thereby affording reliable ESD protection even when there are high voltages present.

In the case of such a semiconductor chip, therefore, the functionality of an ESD protective diode is already integrated into the support of the semiconductor chip, such that additional protective diodes to be arranged outside the semiconductor chip can be dispensed with.

During the production of the semiconductor chips, the semiconductor bodies are therefore arranged on a support assemblage such that a diode structure is assigned to each semiconductor body. During singulation into semiconductor chips, the latter are therefore already protected against ESD damage.

My supports and chips are not restricted by the description on the basis of the examples. Rather, the disclosure encompasses any novel feature and also any combination of features, which in particular includes any combination of features in the appended claims, even if the feature or combination itself is not explicitly specified in the claims or the examples.

The invention claimed is:

1. A support for an optoelectronic semiconductor chip comprising:
   a support body having a first main face and a second main face opposite the first main face,
   at least one electrical plated-through hole extending from the first main face to the second main face and formed in the support body;
   an insulation layer arranged on the first main face, said insulation layer partially covering the electrical plated-through hole;
   a connection area formed on a side of the insulation layer facing away from the support body, said connection area being electrically conductively connected to the plated-through hole;
   the support has a further plated-through hole electrically conductively connected to a further contact area on the second main face of the support body and to a further connection area on that side of the insulation layer facing away from the support body; and
   the further connection area covers the plated-through hole in regions, completely surrounds the connection area in a plan view of the support and is electrically insulated from the connection area and from the plated-through hole.

2. The support according to claim 1, wherein the support body comprises a semiconductor material.

3. The support according to claim 1, wherein the support body has a resistivity of at least 500 Ωcm.

4. The support according to claim 1, wherein a contact area is arranged on the second main face of the support body, said contact area being electrically conductively connected to the plated-through hole.

5. The support according to claim 1, further comprising another insulation layer arranged between the contact area and the second main face.

6. The support according to claim 1, wherein a diode structure is formed in the support body, said diode structure adjoining the second main face of the support body.

7. The support according to claim 6, wherein the diode structure has a first partial region of a first conduction type which encloses a second partial region of a second conduction type in a plan view of the semiconductor chip.

8. The support according to claim 6, wherein
a contact area electrically conductively connected to the plated-through hole and a further contact area electrically conductively connected to the second plated-through hole are arranged on the second main face;
a diode structure is formed in the support body, said diode structure adjoining the second main face of the support body;
the contact area and the further contact area overlap the diode structure in a plan view of the support; and
the contact area and the further contact area connect to one another via the diode structure.

9. The support according to claim 1, wherein the support is formed in a support assemblage provided for production of a plurality of semiconductor chips each comprising a support from the support assemblage.

10. A semiconductor chip comprising a support according to claim 1, wherein a semiconductor body having an active region that generates radiation is arranged on the support on the part of the first main face and is electrically conductively connected to the connection area.

11. The semiconductor chip according to claim 10, wherein a growth substrate for the semiconductor layer sequence of the semiconductor body comprises a semiconductor layer sequence grown on a growth substrate, wherein the growth substrate is removed.

12. The semiconductor chip according to claim 10, wherein a side face of the support body is exposed.

13. The semiconductor chip according to claim 10, wherein a recess is formed in the semiconductor body, said recess extending from the side facing the support through the active region.

14. The support according to claim 1, wherein the insulation layer is arranged in regions between the plated-through hole and the connection area when viewed in a direction running perpendicular to the first main face.

15. The support according to claim 1, wherein:
the support body comprises penetrations extending through the support body in a vertical direction, the plated-through hole being arranged in the penetration; and
the connection area is arranged in an opening of the further connection area wherein a cross section of the opening is smaller than a cross section of the penetration.

* * * * *